US008232136B2

(12) United States Patent
Bulovic et al.

(10) Patent No.: US 8,232,136 B2
(45) Date of Patent: Jul. 31, 2012

(54) METHOD AND APPARATUS FOR SIMULTANEOUS LATERAL AND VERTICAL PATTERNING OF MOLECULAR ORGANIC FILMS

(75) Inventors: Vladimir Bulovic, Lexington, MA (US); Jennifer J. Yu, Palo Alto, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 73 days.

(21) Appl. No.: 12/537,424

(22) Filed: Aug. 7, 2009

(65) Prior Publication Data
US 2010/0032663 A1 Feb. 11, 2010

Related U.S. Application Data

(60) Provisional application No. 61/087,088, filed on Aug. 7, 2008.

(51) Int. Cl.
*H01L 21/00* (2006.01)
*H01L 51/50* (2006.01)
*H01L 51/52* (2006.01)
*H01L 51/56* (2006.01)

(52) U.S. Cl. ............... 438/99; 257/40; 257/E21.214; 257/E51.018; 700/121

(58) Field of Classification Search .......... 257/40, 257/E51.001, E51.018, E21.214; 438/99; 700/121
See application file for complete search history.

(56) References Cited

U.S. PATENT DOCUMENTS

| | | | |
|---|---|---|---|
| 4,266,263 A | 5/1981 | Haberl et al. | |
| 6,160,828 A | 12/2000 | Kozlov et al. | |
| 6,294,398 B1 * | 9/2001 | Kim et al. | 438/22 |
| 6,444,400 B1 * | 9/2002 | Cloots et al. | 430/311 |
| 6,472,692 B1 | 10/2002 | Satoh et al. | |
| 6,498,802 B1 | 12/2002 | Chu et al. | |
| 6,586,763 B2 * | 7/2003 | Marks et al. | 257/40 |
| 7,346,981 B2 | 3/2008 | Borwick et al. | |
| 7,406,761 B2 | 8/2008 | Jafri et al. | |

(Continued)

FOREIGN PATENT DOCUMENTS

DE 10 2007-16995 10/2008

(Continued)

OTHER PUBLICATIONS

Hanseup Kim et al., "Characterization of Aligned Wafer-Level Transfer of Thing and Flexible Parlene Membranes", *Journal of Microelectromechanical Systems*, Dec. 1, 2007, vol. 16, No. 6, pp. 1386-1396.

Meitl et al., "Transfer Printing by Kinetic Control of Adhesion to an Elastometric Stamp," *Nature Materials Nature Publishing Group UK*, vol. 5, No. 1, Jan. 2006, pp. 33-38.

(Continued)

*Primary Examiner* — Evan Pert
(74) *Attorney, Agent, or Firm* — Dianoosh Salehi

(57) ABSTRACT

The disclosure relates to a method and apparatus for micropatterning organic layers of OLEDs. The disclosed methods do not require applying pressure to the film, nor do they require heat treatment, surface treatment or fast release rate of a stamp from the substrate. The disclosed methods are particularly advantageous over the conventional shadow masking techniques for providing large array fabrication with small features. In one embodiment of the disclosure, one or more organic films are selected for the OLED as a function of their individual or combined sublimation temperature. The material is selected in view of the depth and shape of the features that are to be formed in the organic layer. The disclosed embodiments can provide minimum feature size of 13 μm which is suitable for high resolution OLED displays.

27 Claims, 10 Drawing Sheets

U.S. PATENT DOCUMENTS

| | | |
|---|---|---|
| 7,836,574 B2 | 11/2010 | Jafri et al. |
| 2002/0045105 A1 | 4/2002 | Brown et al. |
| 2004/0004988 A1 | 1/2004 | Cok et al. |
| 2005/0230348 A1 | 10/2005 | Kido |
| 2006/0048885 A1 | 3/2006 | Constantin et al. |
| 2010/0288635 A1 | 11/2010 | Komiya et al. |

FOREIGN PATENT DOCUMENTS

| | | |
|---|---|---|
| WO | WO 03-073164 | 9/2003 |
| WO | WO 2004-107403 | 12/2004 |
| WO | WO 2008/133942 | 11/2008 |
| WO | WO 2009/096419 | 8/2009 |

OTHER PUBLICATIONS

International Preliminary Report on Patentability issued on Oct. 6, 2009 for PCT Application No. PCT/US09/030151.

International Preliminary Report on Patentability issued on Feb. 8, 2011 for PCT Application No. PCT/US09/053086.

International Search Report and Written Opinion dated Mar. 29, 2010 issued for PCT Application No. PCT/US2009/056267.

International Search Report and Written Opinion dated Dec. 10, 2010 issued for PCT Application No. PCT/US2009/067801.

International Search Report dated Jun. 16, 2011 for Application No. PCT/US2010/052403.

* cited by examiner

METHOD AND APPARATUS FOR SIMULTANEOUS LATERAL AND VERTICAL PATTERNING OF MOLECULAR ORGANIC FILMS

CROSS-REFERENCE TO RELATED APPLICATIONS

This application claims the benefit of U.S. provisional patent application No. 61/087,088, filed Aug. 7, 2008 for Simultaneous Lateral and Vertical Patterning of Molecular Organic Thin Films Via Microcontact Lift-off Applied to Fabrication of Organic Light Emitting Device Arrays, the entire subject matter of which is incorporated herein.

This invention was made with government support under grant number FA9550-04-1-0462 awarded by the Air Force Office of Sponsored Research, grant number HR0011-06-1-0045 awarded by the Defense Advanced Research Project, and grant number DMR-0213282 awarded by the National Science Foundation. The government has certain rights in this invention.

BACKGROUND

1. Field of the Invention

The disclosure generally relates to method and apparatus for simultaneous lateral and vertical patterning of molecular organic thin films via microcontact patterning. The disclosed process can be applied to fabrication of organic light emitting device arrays and has been found particularly advantageous over the conventional techniques in that large arrays can be formed without cost constraints of the conventional techniques.

2. Description of Related Art

Organic light emitting devices (OLEDs) are thin, brightly emissive and efficient diodes which have been gaining traction in display technology. OLEDs have fast switching speeds which make them ideal for flat panel display. OLEDs do not require backlighting which makes them capable of producing video displays with a fraction of the thickness of plasma or LCD displays.

A challenge in fabricating OLEDs is patterning micron-sized features of molecular organic thin films over large areas. OLEDs are typically patterned by shadow masking. In shadow masking a rigid stencil shadow mask is placed between the source material and the substrate to pattern the deposited thin film. This technique is limited in resolution due to lateral diffusion from the spacing between the shadow mask and the substrate and the thickness of the shadow mask. Experience shows that it is difficult to make large area shadow masks with features smaller than 150 µm. High-resolution displays require 30-µm-sized features.

Alternative techniques for patterning molecular organic thin films include: laser induced thermal imaging ("LITI"), laser induced pattern-wise sublimation ("LIPS"), molecular jet printing ("MoJet") and contact stamping techniques. LITI and LIPS rely on thermal transfer of organic layer and are limited in resolution due to the ability to focus the laser. MoJet uses a Micro-Electro-Mechanical System ("MEMS") valve to pattern the organic layer and is not limited in resolution, but the valve is susceptible to clogging. Large area scalability of these techniques requires multiple lasers or MEMS valves which is both costly and labor intensive.

The contact stamping method can produce features smaller than 30 µm by applying a patterned stamp. However, conventional contact stamping requires elevated temperature and pressure which are unsuited for OLED fabrication. Heat and pressure can be detrimental to certain organic material used in the OLED as they can cause contamination or alteration of the organic component.

Accordingly, there is a need for a method and apparatus for OLED manufacturing which enables inexpensive, precise large scale manufacturing without causing OLED alteration or contamination.

SUMMARY

The invention relates to a method for fabricating a large area OLED structure which can produce features smaller than 30 µm without heating or applying pressure to the organic layer. A proxy for the intermolecular bonding strength is the sublimation temperature of the organic material. Material having lower sublimation temperature have weaker intermolecular bonds and provide greater lift-off thickness. Thus, knowing the desired feature sizes, one or more organic layers can be selected to enable large scale fabrication of the OLED.

In one embodiment of the invention, a subtractive patterning technique is used to define features of nanometer range thickness on molecular organic thin films by placing a relief stamp of elastomeric material in conformal contact with an organic thin film. The stamp is then removed or delaminated from the organic material, lifting with it a portion of the organic film. The thickness of the removed film is a function of the film's sublimation temperature. The disclosed techniques require no additional pressure and can be implemented at ambient temperature (i.e., about 18-25° C.).

In another embodiment of the disclosure, a large substrate is provided with a first electrode and a first organic layer deposited thereon. The organic layer can be defined by having one or more organic films. A plurality of patterning stamps are then simultaneously brought into contacted with the organic layer. The contact can be conformed and without applying any external pressure to the stamp. The plurality of stamps define a single device or can define multiple smaller stamps brought into contact with different regions of the organic layer. The stamps are then delaminated from the organic layer, leaving behind an array of OLED cells or pixels having identical features formed thereon.

In still another embodiment, the disclosure relates to a method for simultaneous lateral and vertical patterning of a semiconductor structure. The method includes the steps of forming a first electrode on a glass substrate; depositing a hole injection layer over the first electrode; patterning a portion of the hole injection layer by conformingly contacting a portion of a stamp with the hole injection layer and thereafter removing the stamp to form a first pattern, the first pattern having a depth; depositing an electron transport layer over the hole transport layer; and forming an second electrode over the hole transport layer. The hole injection layer can be selected to have a sublimation temperature as a function of the depth of the first pattern.

In another embodiment, the disclosure relates to a method for patterning an organic light emitting diode ("OLED") by forming a first electrode on a substrate; defining at least one feature for the OLED, the feature having a first depth; selecting an organic layer for deposition on the substrate as a function of the layer's sublimation point and the first depth; forming the organic layer to electrically communicate with the first electrode; conformingly contacting a stamp with the organic layer and delaminating the stamp to subtractively form at least one feature and forming a second electrode over the organic layer.

In still another embodiment, the disclosure relates to a method for forming a multi-array OLED panel. The method comprises the steps of (a) forming a first electrode panel on a substrate, the first electrode communicating with each of a plurality of pixels for the OLED panel; (b) forming a first organic layer on the substrate, the organic layer extending to each of the plurality of pixels; (c) conformingly contacting a stamp with the organic layer of one pixel and removing the stamp to form a first pattern having a feature and a depth on said pixel; and (d) moving at least one of the substrate or the stamp relative to the other and repeating step (c) to pattern the first pattern on at least one other pixel. The organic layer can be selected as a function of a sublimation temperature of the organic layer and the first depth. The stamp contacts the surface of the organic layer absent external pressure and at ambient temperature. In a preferred embodiment, the patterning process is conducted under a non-oxidizing or a noble gas environment, such as nitrogen.

In another embodiment, the disclosure relates to a device for manufacturing an OLED panel. The device comprises a processor circuit in communication with a memory circuit and an actuation system. The memory circuit stores instructions for the processor circuit to: position a substrate relative to a stamp at a first position, the substrate having a first organic layer thereon and defining a plurality of OLED pixels; bring the stamp into conformal contact with a first of the plurality of pixels; remove the stamp from the substrate to thereby remove a portion of the organic layer forming a first pattern on the organic layer; and move the substrate relative to the stamp at a second position. The organic layer can be selected as a function of the depth of the first pattern.

DETAILED DESCRIPTION

Contact stamping techniques for patterning molecular organic thin films have been demonstrated with both additive and subtractive methods. Additive transfer occurs by transferring film material on the raised features of a relief stamp to a target substrate. A suitable material for forming the stamp is poly(dimethylsiloxane) ("PDMS") and rigiflex poly(urethaneacrylate) ("PUA"). In conventional additive transfer, the stamp is contacted with the organic and inorganic substrates along with applied pressures and elevated temperature of about 50° C.

Subtractive patterning occurs by removing film material in contact with the raised features of the relief stamp. Subtractive patterning uses a partially cured epoxy stamp and/or a PDMS stamp and requires a heating step around 80-90° C. Additive and subtractive techniques have been combined to transfer a metal shadow mask onto the substrate and to remove the mask after organic deposition. As discussed, pressure and elevated temperature render these method unsuitable for OLED fabrication.

According to one embodiment of the invention, a contact stamping technique is disclosed which is capable of producing micro-pattern organic thin films without requiring elevated temperature, pressure, or fast release rate. The contact stamping technique is subtractive. The disclosed embodiments have been used successfully in fabricating two-color OLED structure with 13-μm-sized features.

In one embodiment of the disclosure, a PDMS relief stamp is brought in conformal contact with an organic layer. No pressure is applied and the process is conducted at ambient temperature. The stamp is left for a few minutes in contact with the organic film and is then gently removed or delaminated. The stamp removes with it a quantity of organic film which comes into contact with the raised features of the stamp. Separation of the stamp from the substrate typically occurs from a corner of the stamp and the line of separation can be seen propagating across the stamp area as the stamp is removed. The removal results in a patterned organic film having the desired features.

Figure 1:
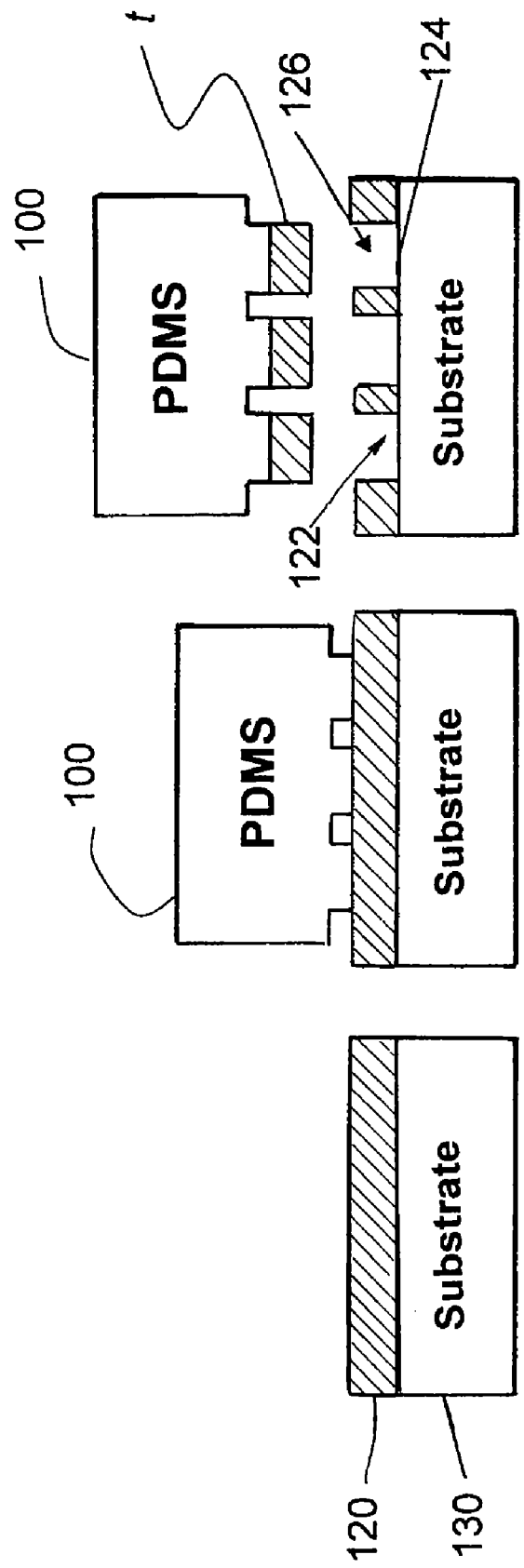
FIGS. 1A, 1B and 1C schematically illustrate a patterning technique according to one embodiment of the disclosure.

FIGS. 1A & 1B schematically illustrate a patterning technique according to one embodiment of the disclosure. In FIG. 1A, stamp 100 is brought into contact with organic layer 120. Organic layer 120 has a starting film thickness of h. Organic layer 120 is formed over substrate 130. Organic layer 120 can include one or more of hole-blocking material 3-(4-Biphenylyl)-4-phenyl-5-tert-butylphenyl-1,2,4-triazole ("TAZ"), and hole-transport materials N,N'-Bis(3-methylphenyl)-N,N'-bis(phenyl)-benzidine ("TPD"), N,N-Bis(naphthalen-1-yl)-N,N'-bis(phenyl)-benzidine ("NPB"), and 9,9-Bis[4-(N,N-bis-naphthalen-2-yl-amino)phenyl]-9H-fluorene ("NPAPF").

When stamp 100 is brought into conformal contact with organic layer 120, the raised features of the stamp (interchangeably, ridges) contact organic layer 120. Because no pressure is applied, the ridges do not penetrate the surface of layer 120. In FIG. 1B, stamp 100 is lifted or delaminated from organic layer 120, removing with it a film of thickness t from organic layer 120. The removed layer has a constant thickness across all shown ridges. That is, each of ridges 122 removes the same thickness of film from layer 120. After the lift-off, organic layer 120 is patterned with features 122, 124 and 126, which are of the same depth. Moreover, features 122, 124 and 126 are substantially identical in their structure and form, having walls that are perpendicular to the top surface of organic film 120. Careful control of the stamp release can improve consistent patterning lift-off thickness.

The process shown in FIGS. 1B and 1C can be performed in a noble gas environment. In a preferred embodiment, the steps are performed in a nitrogen environment. It has been found that an inert environment can enhance OLED fabrication and produce better device performance.

The features formed on the PDMS stamp can have any form. In one aspect of the invention, the PDMS stamp can form ridges or grooves in the organic film. In another aspect, the PDMS stamp can be molded to form notches or circles on the organic film.

Figure 2:
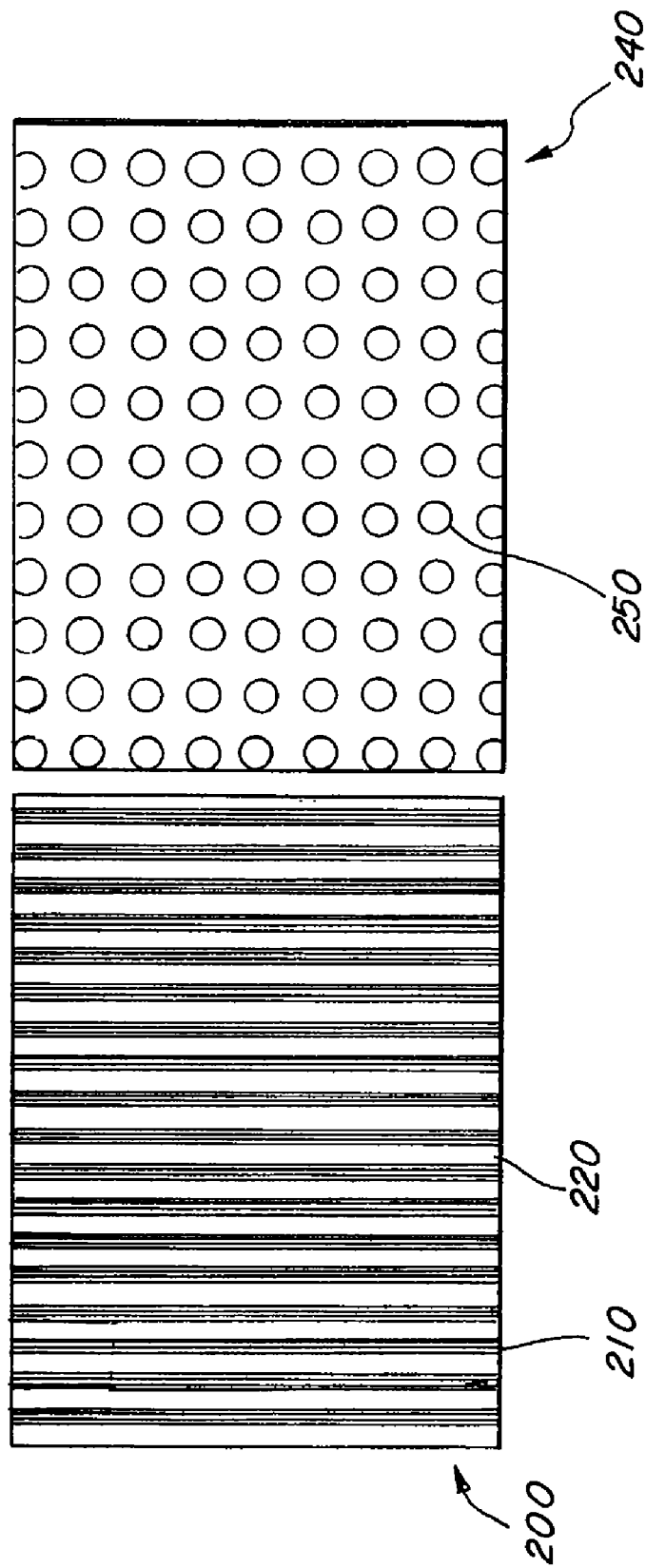
FIG. 2A is a magnified OLED film having a striped pattern.
FIG. 2B is a magnified OLED film having a spotted pattern.

FIG. 2A is a magnified OLED film having a striped pattern. In FIG. 2B, the dark areas 210 are the ridges formed in an organic top layer. Ridges 210 are separated by grooves 220 on the surface of organic film 200. The grooves were formed using the technique shown in the Fig. The PDMS stamp was formed with a plurality of ridges spaced apart at regular intervals. After the stamp was removed from the organic film surface, grooves 220 were formed in the surface of the film. Grooves 220 had uniform depth and identical forms. Because there is no size limitation to the application of this technique, the technique can be used to form large arrays of OLED pixels with one stamp.

FIG. 2B is a magnified OLED film having a spotted pattern. In producing the spotted pattern of FIG. 2B, a PDMS stamp having a plurality of cylindrical protrusions was used. The stamp was formed by molding the PDMS stamp to the desired specification.

The PDMS stamp is then brought into conformal contact with organic layer 240 without adding pressure or temperature. The stamp is then removed, removing with it circular layers of organic film as shown by spots 250. Spots 250 are cylindrical in form and have a substantially identical form and depth.

Figure 3:
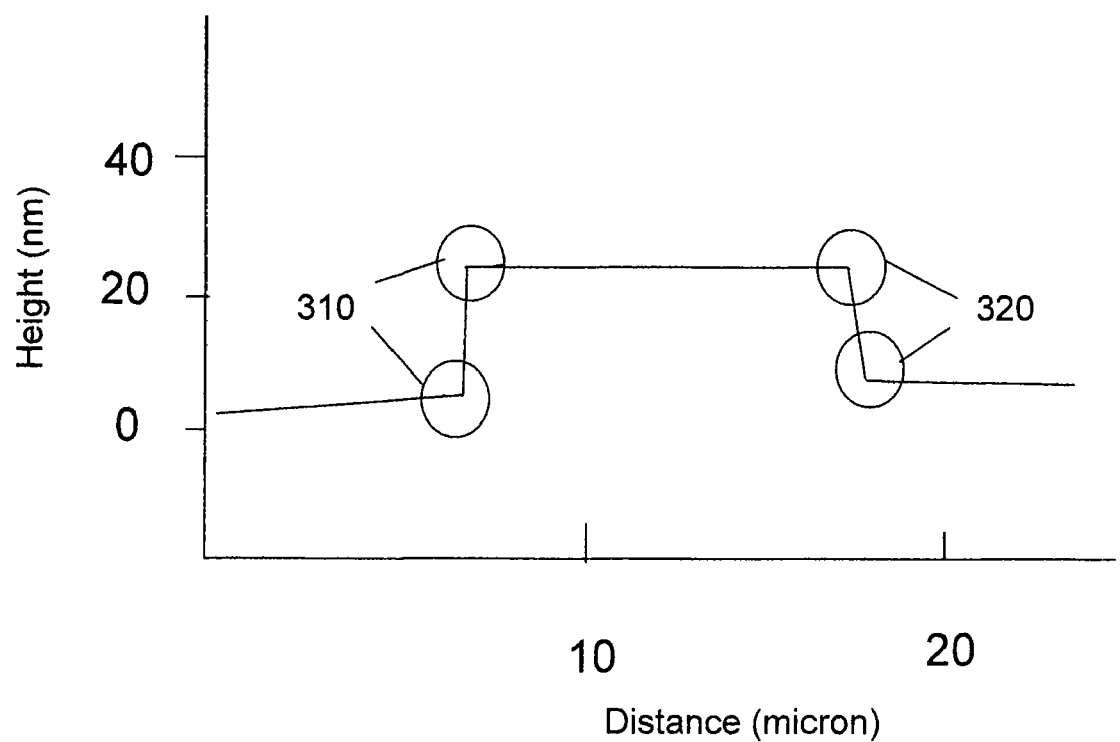
FIG. 3 shows the height profile of the organic film of FIG. 2A for the portions removed with the stamp.

FIG. 3 shows the height profile of the organic film of FIG. 2A. As shown in FIG. 3, the transition regions 310 and 320 are very sharp. The transition regions are locations where the molecular separation of organic film is most acute. The sharpness of the transition regions is particularly suited for OLED fabrication. The shown profile is difficult to produce with conventional methods, particularly when implementing large scale fabrication.

Figure 4:
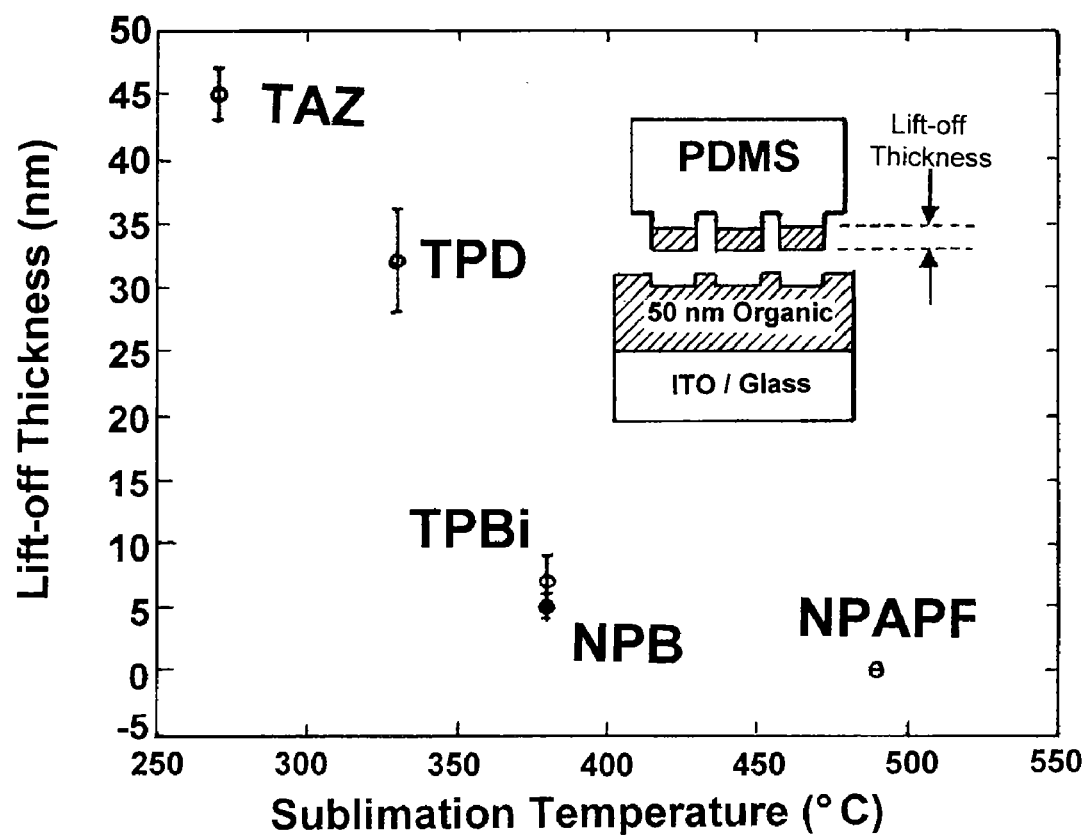
FIG. 4 shows the relationship between sublimation temperature and the lift-off thickness for several organic material.
Figure 5:
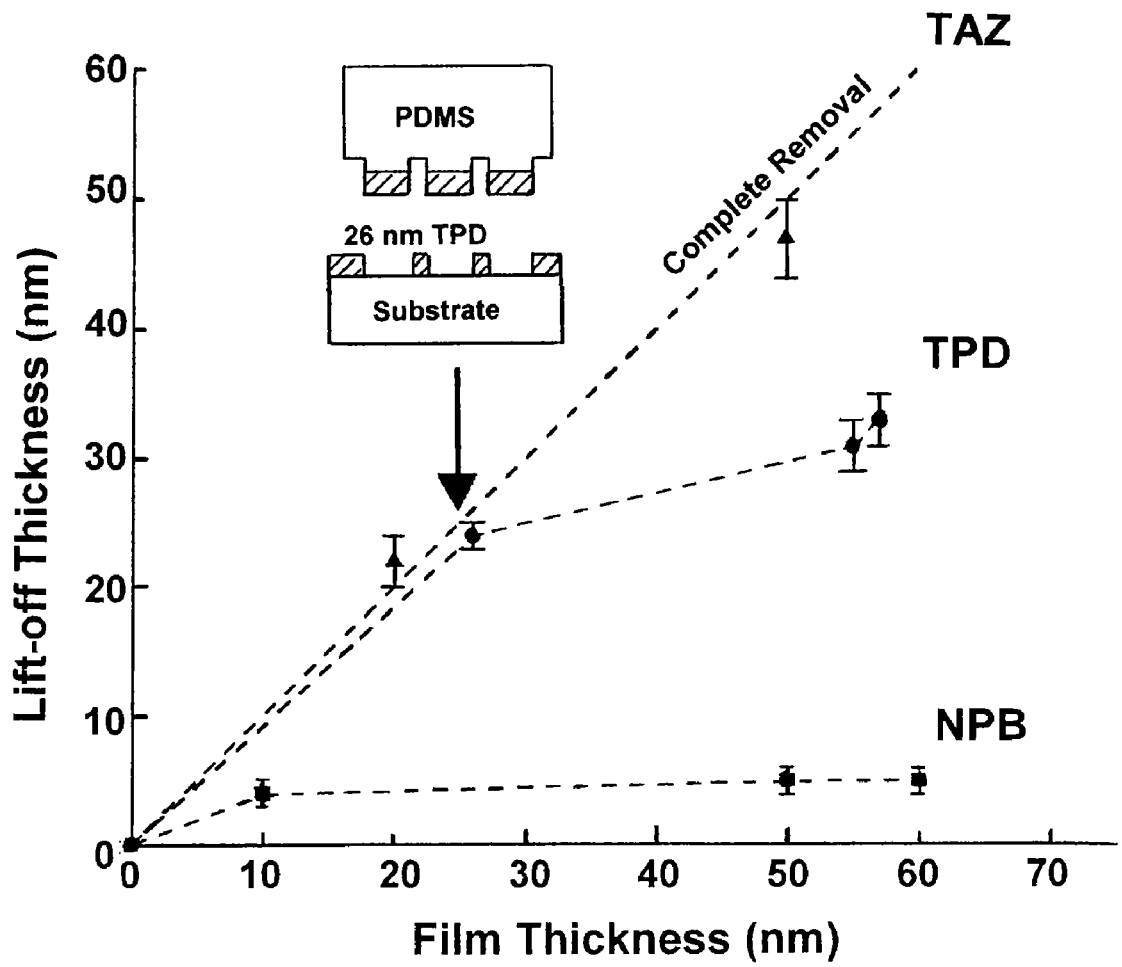
FIG. 5 shows the relationship between the starting film thickness and the lift-off thickness for several organic material.

FIG. 4 is the relationship between sublimation temperature and lift-off thickness. For patterning to occur, the adhesion strength between the PDMS and the organic molecules has to be larger than the intermolecular bonding strength within the organic layer to be patterned. It can be seen that, for example, pure TAZ has a sublimation temperature of about 120° C. Consequently, if an organic layer having substantially pure TAZ is used, then the lift-off thickness of a film removed according to the disclosed method would be about 45 nm. On the other hand, NPAPF has a sublimation temperature of about 490° C. The lift-off testing showed that a layer of about 1-3 nm would be lifted at ambient temperature and without applying pressure to the stamp.

FIG. 4 reveals a general trend that lower sublimation temperature materials result in a thicker lift-off layer of the patterned film. As stated, organic cohesion is related to the sublimation temperature of the organic material, which is indicative of the amount of energy necessary to break the intermolecular bonds. Lower sublimation temperature materials have weaker intermolecular bonds, allowing for a more complete patterning of the film.

Thus, according to one embodiment of the disclosure, a combination of two or more material is selected to form an organic layer. The organic film is configured to produce the desired lift-off thickness. In other words, the organic layer can be selected on the basis of the groove depths and the size of the features of the OLED. Conversely, a combination of the stamp material and organic layer can be selected according to desired feature sizes. The proper selection of the organic film enables reproducing identical features in a large array fabrication process. The produced features will be substantially identical across the array without using shadow masking or requiring high temperature/pressure treatment.

A complete layer patterning of an organic film requires choice of a low sublimation temperature organic material such as TAZ. Increasing the film thickness of TAZ to 100 nm or decreasing film thickness below 50 nm can result in removal of the film. For materials with higher sublimation temperatures, such as TPD, partial layer patterning occurs in which 32 nm of a 50 nm thick TPD film on ITO can be removed. Increasing the film thickness to 100 nm does not necessarily increase the lift-off thickness, but decreasing the film-thickness below 30 nm allows for removal of the entire film and possibly a portion of the under layer.

Referring again to FIG. 4, the relationship between the starting film thickness and the lift-off thickness is illustrated. The trend of FIG. 4 indicates that certain material are more prone to complete removal.

As stated, the disclosed methods are suited for patterning the emissive layer of OLEDs. Possible underlying layers can include ITO, silicon substrates and organic layers such as hole-injecting polymer PEDOT:PSS or hole-transport material. Experimental results show that changing the substrate from ITO to silicon had no change on the lift-off layer thickness for TAZ and TPD. A five minute oxygen plasma treatment resulted in a 1-3 nm decrease in lift-off thickness. This decrease is well within the margin of error for the film thickness. The reduction in film thickness is caused by the enhanced affinity of the organic material to the substrate since oxygen plasma treatment leads to increased surface energy of the substrate. This is further evidenced by complete wetting of ethylene glycol and water to the treated surface.

On the other hand, applying the disclosed technique to an organic film having an underlayer of another organic film can change the lift-off thickness. For example, an experiment was conducted by depositing a 15 nm thick TAZ layer on top of 50 nm thick TPD. The two layers were supported by a glass substrate. A PDMS stamp was used to remove the TAZ layer and the complete TAZ layer was removed together with about 25 nm of the underlying TPD. In another experiment, a 15 nm thick TAZ layer was formed over 50 nm thick NPB underlayer. A PDMS stamp was used according to the disclosed embodiments. The complete TAZ layer was removed together with a portion of the TPD layer.

Experiments also show that changing the underlying layer to PEDOT:PSS changes the lift-off thickness within 1 nm for TPD films. Changing the underlying layer to a small molecule organic film can change the lift-off thickness. For a 15 nm thick TAZ film on top of 50 nm TPD or NPB 1film, 40 nm or 21 nm of organic film is removed. The complete TAZ film is removed, with roughly 25 nm of TPD or 6 nm of NPB.

In addition, changing the stamp to a more hydrophilic surface by using a 5 minute UV ozone treatment decreased the lift-off film thickness by 2 nm, which is within the measurement error. The decrease in lift-off thickness can also be explained by a decrease in adhesion of the stamp to the organic surface.

To demonstrate compatibility of the disclosed stamping technique in fabrication of OLEDs, a conventional un-patterned OLED was compared to a patterned OLED using the disclosed technique on the hole transport layer. A TPD layer was deposited over a glass substrate. A PDMS stamp was formed to have grooves and ridges of desired thickness. The thickness of the TPD layer has been shown not to significantly affect the luminescence, current and voltage ("LIV") characteristics of the TPD/Alq$_3$ device. Thus, an OLED patterned using the disclosed technique which results in a thinner TPD layer should exhibit similar LIV characteristics to the shadow-masked device with thicker TPD layer.

Figure 6:
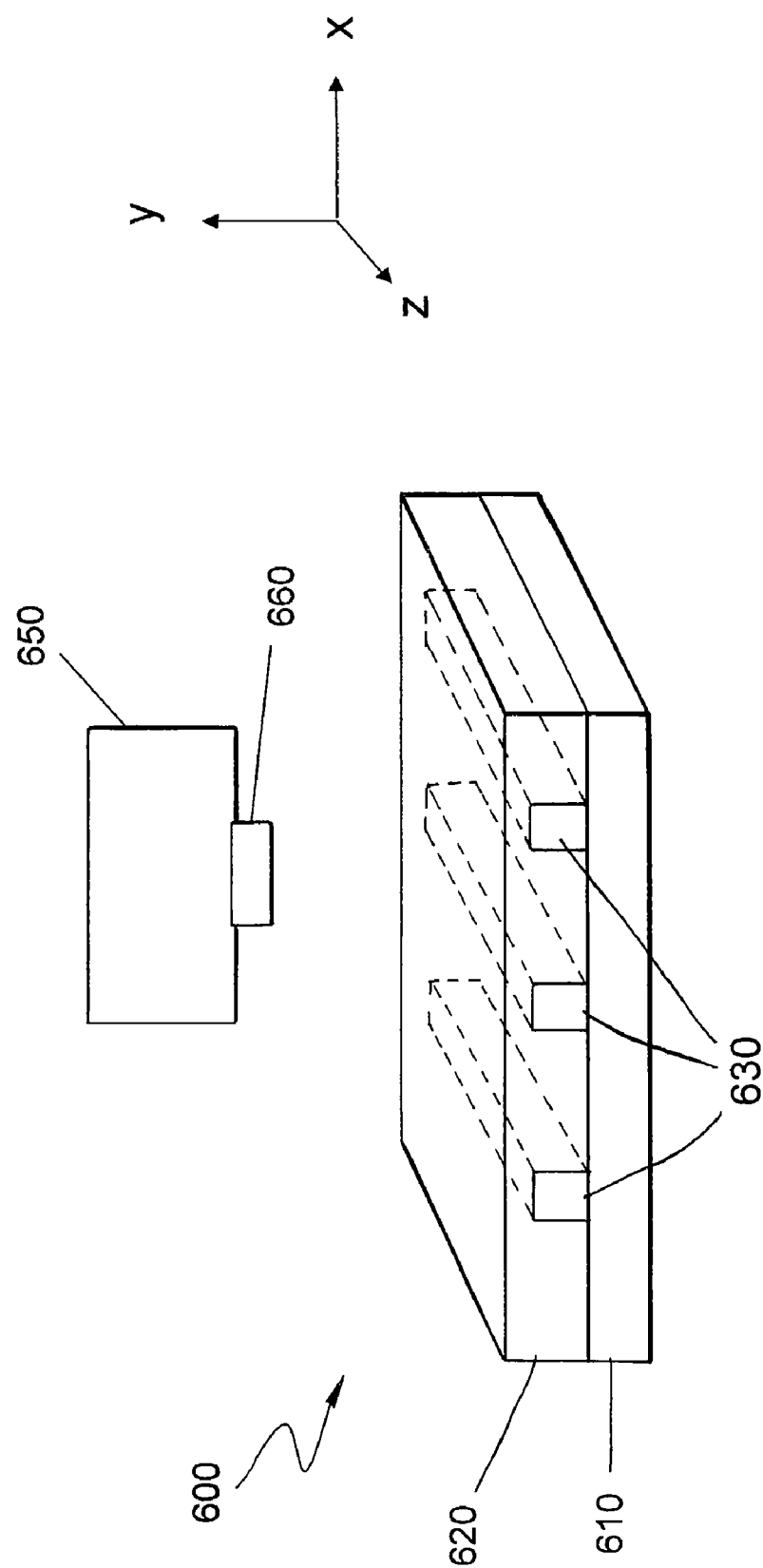
FIG. 6 is a schematic illustration of an OLED manufacturing device according to one embodiment of the disclosure.

FIG. 6 shows that patterned and un-patterned OLEDs exhibit similar LIV characteristics. It can be seen from the graph of FIG. 6 that the patterning itself does not affect device characteristic and neither does the thickness of the transfer layer.

The subtractive patterning disclosed herein is particularly suitable for large scale production of OLED displays. FIG. 6 is a schematic illustration of an OLED manufacturing device according to one embodiment of the disclosure. For simplicity, FIG. 6 shows single OLED pixel 600 and single stamp 650, movably positioned relative to each other. OLED pixel 600 includes substrate 610, supporting electrodes 630 and organic layer 620. Other layers and functional features may be included in OLED pixel 600. OLED pixel 600 can be one of a large array of pixels formed on substrate 610.

Substrate 610 can be configured to move relative to stamp 650 in the X, Y and Z directions using a processor circuit (not shown), an actuation system (not shown) and a memory circuit (not shown). The memory circuit can be configured with instructions to move one or both of the stamp and the OLED layer relative to each other, bringing them into conformal contact and removing or taking them apart.

Organic layer 620 can be comprised of one or more organic films. When stamp 650 is brought into conformal contact with organic layer 620, ridge 660 contacts the top surface of organic layer 620. The contact is preferably made without exerting any pressure beyond the normal surface contact. The process is preferably implemented at ambient temperature and in a noble gas environment. After ridge 660 and organic layer 620 are brought into contact, an actuation system (not shown) can be directed to separate stamp 650 from surface of organic layer 620 and thereby remove a portion of organic layer 620. This creates the desired features on the surface of organic layer 620.

The illustrative embodiments of FIG. 6 are shown with a unitary stamp and OLED pixel. Nonetheless, the disclosed implementation is not limited thereto and can be extended to have a number of stamps simultaneously forming the desired features in a corresponding number of OLED pixels. Alternatively, the process can be configured to have a single stamp sequentially create the desired features in the plurality of OLED pixels. In implementing the latter process, a cleaning solution can be used to remove any organic material adhering to ridge 660.

Experiment 1—Fabrication of OLEDs

Glass substrates are cleaned using a mixture of a cleaning solution and water, rinsed and sonicated with de-ionized water, acetone and boiling isopropanol and then treated with 5 minutes of oxygen plasma before spin coating. PEDOT:PSS was spin coated at 10° C. ramp and 3000 rpm for 30 seconds and subsequently baked for 10 minutes at 150° C. on a hotplate with glass dish cover. The samples were moved into a nitrogen glove box for organic deposition. Thermal evaporation of the organic layers occurred at pressures lower than $5 \times 10^{-6}$ Torr, and deposition of organic layers ranged 1-5 A/s. The organic lift-off procedure was also performed in the nitrogen glove box on one of the two devices. After patterning, the device was completed by depositing the remaining organic layer and electrode cap of 50 nm Mg:Ag (10:1 weight ratio)/50 nm Ag.

The PDMS stamp consists of a 10:1 weight ratio of base to curing agent from a Silicone Elastomer Kit. The mixture was stirred with 100 strokes clockwise and 100 strokes counter clockwise and then poured on silicon masters. The resulting product was placed under vacuum for at least 30 minutes to release trapped air bubbles. The PDMS was then placed in an oven and baked at 60° C. for about five hours. After cooling, the PDMS stamps were released from the silicon masters and cut into 5 mm sized cubes.

The PDMS stamp was then placed in contact with organic film to be patterned, left on for a few minutes and then gently pulled off. Separation of the stamp from the substrate typically occurred from a corner of the stamp and could be seen propagating across the stamp area. Patterning was conducted in a nitrogen environment.

Lift-off film thickness was measured using atomic force microscopy. Each data point on the plots for lift-off film thickness represents several measurements done on separate stamping trials that were then averaged. The error bar represents variation in lift-off thickness result.

The original film thickness was recorded from a crystal thickness monitor whose tooling factors were initially calibrated with ellipsometry. In some cases, the film thickness was measured after growth for better accuracy. However, in the case where organic films were grown on ITO, this was not possible since ellipsometry requires a reflective surface. Error in film thickness measurement can vary up to 2 nm on a single substrate and up to 4 nm from substrate to substrate due to position of the substrate during evaporation, as measured from ellipsometry The results of the experiment indicate that incomplete film removal (or fractional removal) is the expected outcome of the contact-patterning of the Van-der-Waal-bonded organic thin film and can be used to controllably remove partial-thickness of thin film organic material. The disclosed technique allows formation of vias and trenches for large scale manufacturing of OLEDs.

Experiment 2—Fabrication of OLEDs

Figure 7A:
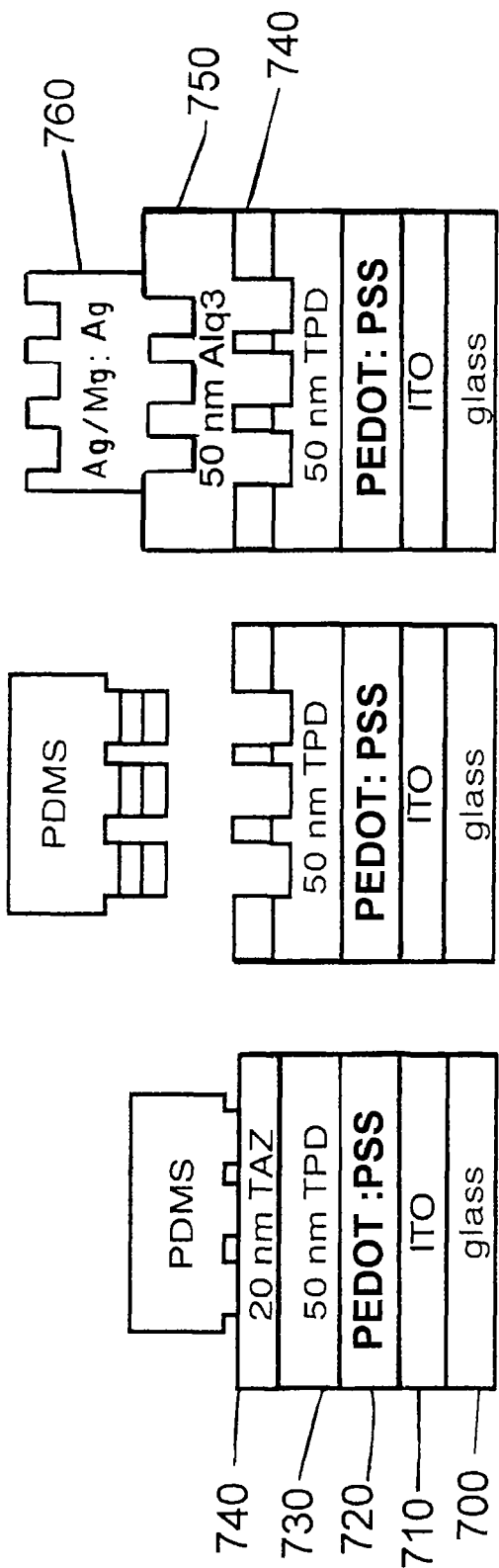
FIG. 7A schematically illustrates an exemplary fabrication process.

Several OLEDs were fabricated on ITO-coated glass substrates by first cleaning the substrate with sonication and then rinsing with de-ionized water, acetone, and boiling isopropanol. The substrates were treated by exposure to oxygen plasma for about five minutes. PEDOT:PSS was spin coated at 10° K ramp and 3000 rpm for 30 seconds and subsequently baked for 10 minutes at 150° C. on a hotplate with glass dish cover. The samples were moved into a nitrogen glove box from where they were loaded into an integrated organic deposition vacuum chamber. A 50 nm thick TPD film and 20 nm thick TAZ film were thermally evaporated at base pressure of less than $5 \times 10^{-6}$ Torr. Substrates were transferred back into the nitrogen-filled glove box where they were patterned using the stamp lift-off technique. Following the patterning step, the devices were coated with a 50 nm thick film of aluminum-tris-quinolate ($Alq_3$), the electrode cap of 50 nm thick Mg:Ag (10:1 weight ratio) and 50 nm thick Ag. The fabrication process and the final device structure are schematically illustrated in FIG. 7A, where glass substrate 700 supports ITO 710, PEDOTS:PSS layer 720, TPD layer 730, TAZ layer 740, $Alg_a$ layer 750 and electrode cap 760.

By patterning TAZ layer 740 on top of TPD layer 730, a blue-emitting or a green-emitting device results. The OLED emits blue light from the TPD layer when the TAZ hole blocking layer is present. The OLED emits green light from the $Alq_3$ layer when the TAZ layer is removed.

Figure 7B:
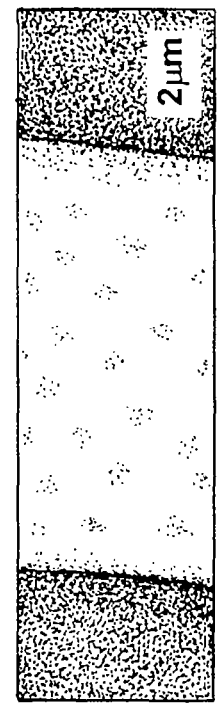
FIG. 7B shows the Atomic Force Microscope (AFM) of a patterned 20 nm thick TAZ film on TPD.
Figure 7C:
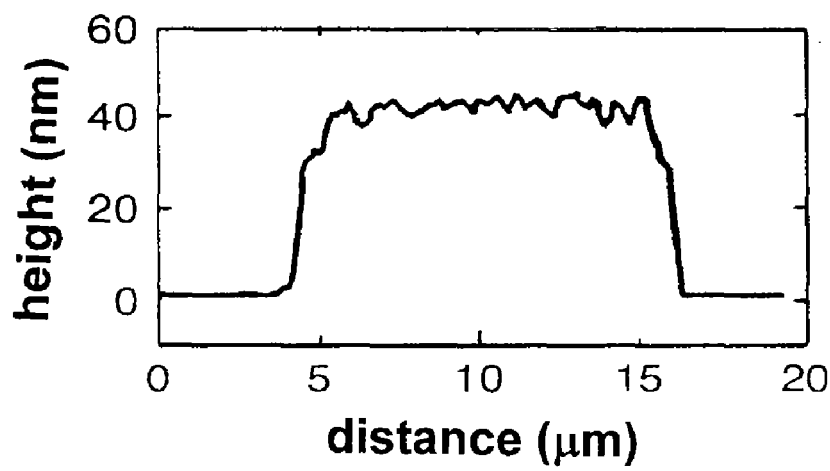
FIG. 7C is the AFM scan showing that 20 nm thick TAZ film is removed together with about 25 nm of the underlying TPD film.
Figure 7D:
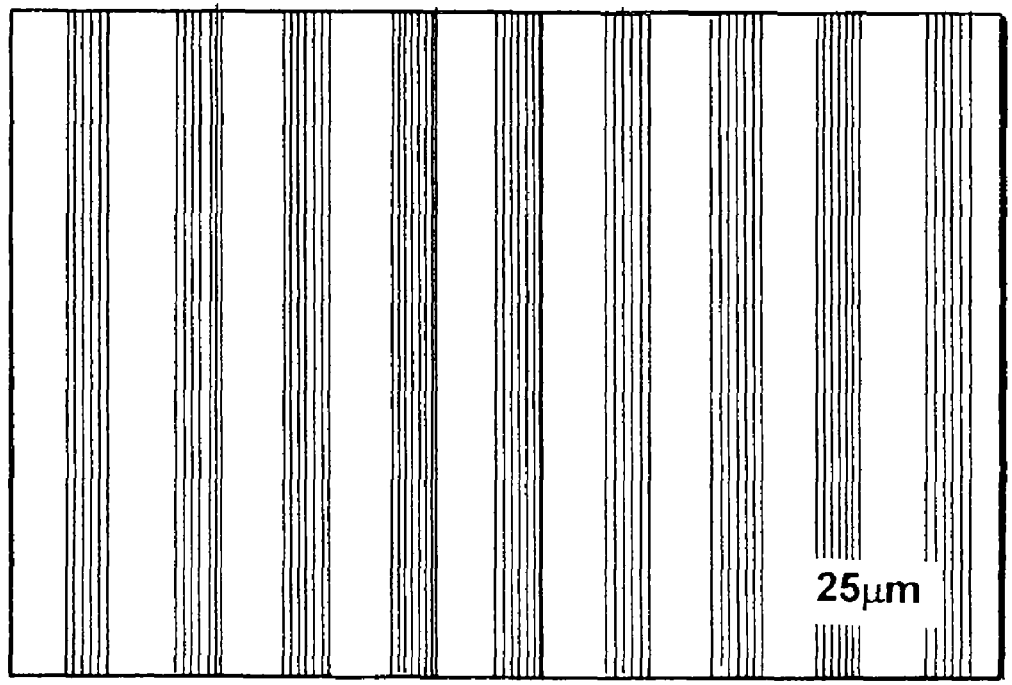
FIG. 7D shows electroluminescence from the two-color patterned device of FIG. 7A.

FIG. 7B shows Atomic Force Microscope view of a patterned 20 nm thick TAZ film on TPD. FIG. 7C is an AFM scan showing that 20 nm thick TAZ film is removed together with about 25 nm of the underlying TPD film. FIG. 7D shows electroluminescence from the two-color patterned device of FIG. 7A. This experiment shows that the device fabricated according to the disclosed embodiment is sufficiently capable of producing the desired electroluminescence.

Experiment 3—Large Scale Fabrication

To evaluate suitability of the CLOP technique in fabrication of OLEDs, a set of OLEDs with blanket deposited organic films was compared to a set of OLEDs in which the lift-off patterning was applied to remove partial thickness of the hole transport layer. To avoid variation in the quality of the organic thin films, both devices were grown simultaneously on the same substrate.

Figure 8A:
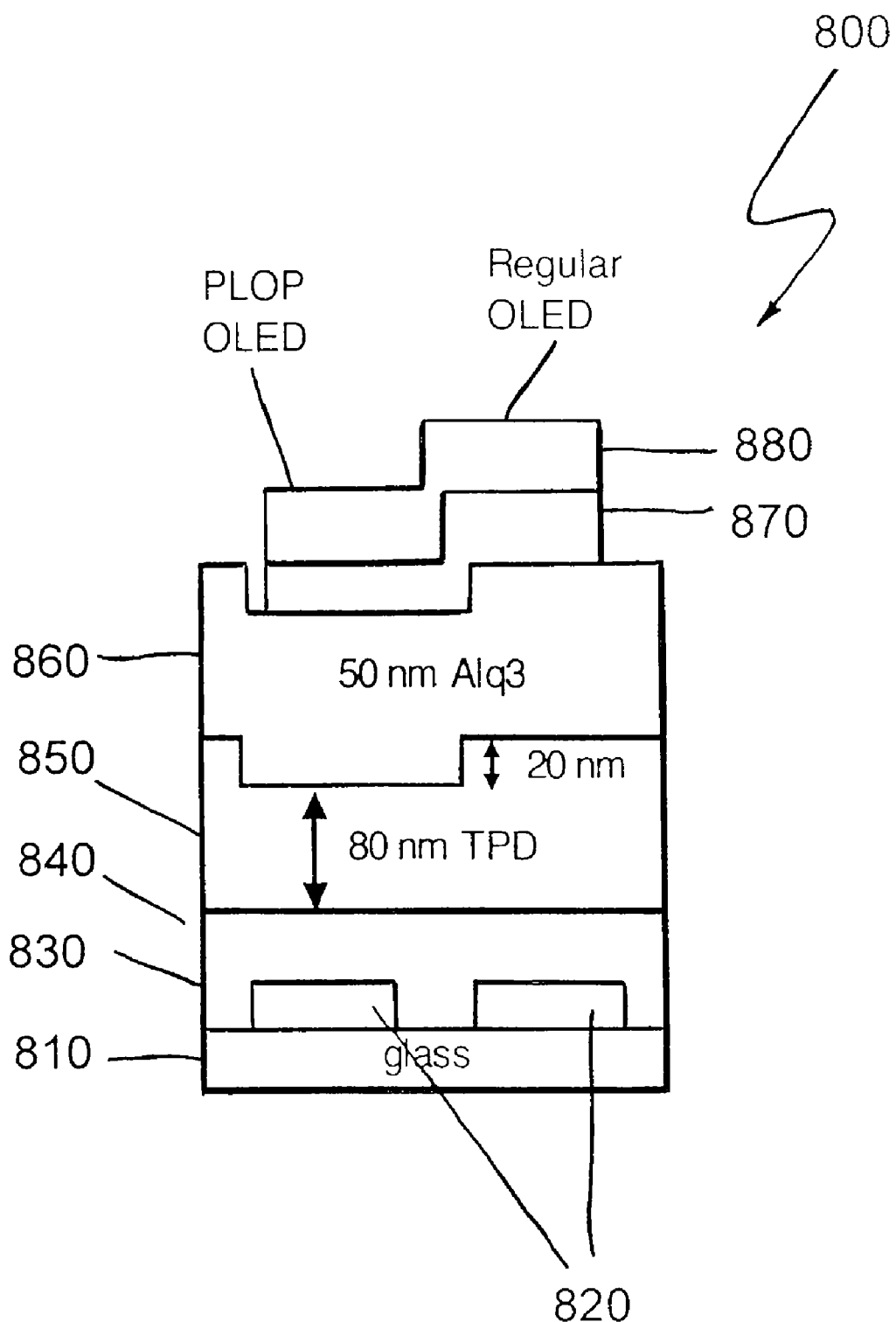
FIG. 8A schematically illustrates the structure for an exemplary OLED device.

FIG. 8A schematically illustrates the device patterned according to the disclosed embodiments. Namely, device 800 of FIG. 8 includes substrate 810, supporting ITO electrodes 820 and layer 830 which comprises PEDOT:PSS. TPD layer 840 had an initial thickness of about 100 nm. Using the disclosed patterning technique a portion of the TPD layer 840 has been patterned to form a via 20 nm deep. Layer 850 is Alq3 and is about 50 nm thick. The final structure has a common Mg:Ag cathode (layer 860) and independent ITO (layer 870) cathode. Other than the 20 nm via, the base line device had an identical structure to that of FIG. 8A.

Figure 8B:
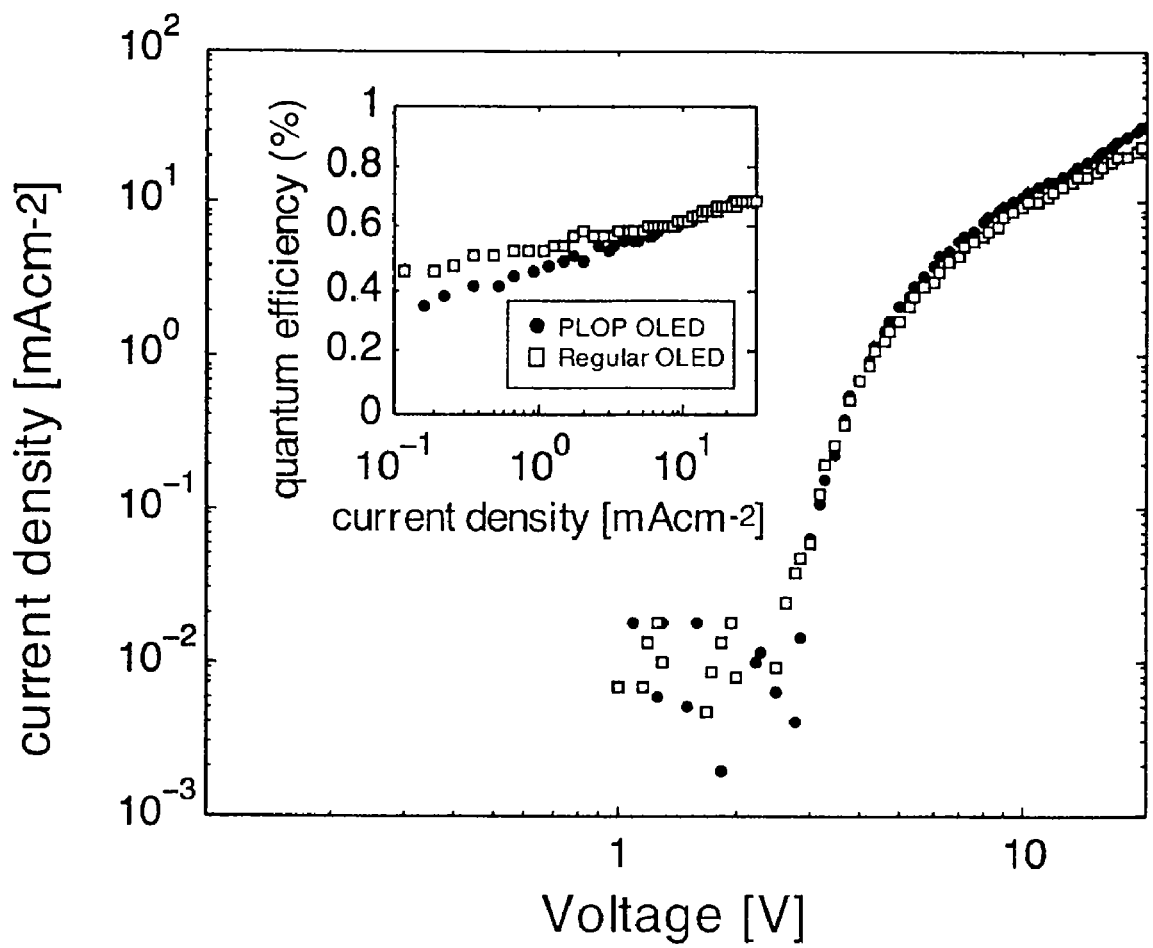
FIG. 8B plots a comparative current density of a conventional OLED device and an OLED device manufactured according to the disclosed embodiments.

It was anticipated that a change in thickness of the TPD layer would not significantly change the luminance-current-voltage (LIV) characteristics of a TPD/$Alq_3$ OLED. Therefore, an OLED patterned using CLOP which results in a thinner TPD layer should exhibit similar LIV characteristics to the un-patterned device with the thicker TPD layer. FIG. 8B plots the current density versus the voltage for this experiment. FIG. 8B also shows the quantum efficiency characteristics of the patterned OLED compared to the un-patterned OLED. From the concurrence of the LIV plots of the two devices, it can be seen that patterning does not deleteriously affect TPD film performance.

While the principles of the disclosure have been illustrated in relation to the exemplary embodiments shown herein, the principles of the disclosure are not limited thereto and include any modification, variation or permutation thereof.

What is claimed is:

1. A method for simultaneous lateral and vertical patterning of a semiconductor structure, the method comprising:
    forming a first electrode on a glass substrate;
    depositing a hole injection layer over the first electrode;
    patterning a portion of the hole injection layer by conformingly contacting a portion of a stamp with the hole injection layer and thereafter removing the stamp to form a first pattern, the first pattern having a depth;
    depositing an electron transport layer over the hole transport layer; and
    forming an second electrode over the hole transport layer;
    wherein the hole injection layer is selected to have a sublimation temperature as a function of the depth.

2. The method of claim 1, wherein the hole injection layer further comprises an organic material.

3. The method of claim 1, wherein the hole injection layer includes one or more material selected from the group consisting of TAZ, TPD, TPBi, NPB and NPAPF.

4. The method of claim 1, wherein the hole injection layer is selected to have a lower sublimation temperature as the stamp defines a plurality of ridges.

5. The method of claim 1, wherein the hole injection layer further comprises a first organic film and a second organic film.

6. The method of claim 1, wherein the hole injection layer further comprises a first organic film and a second organic film and wherein the patterning step removes at least a portion of the first organic film and a portion of the second organic film.

7. The method of claim 1, wherein the depth is in the range of 10-40 nm.

8. The method of claim 1, wherein conformingly contacting the stamp to the hole injection layer is substantially without exerting external pressure.

9. The method of claim 1, wherein the step of patterning a portion of the hole injection layer further comprises conformingly contacting a portion of the stamp with the hole injection layer without exerting pressure and at ambient temperature.

10. An organic light emitting diode formed by the method of claim 9.

11. A method for patterning an organic light emitting diode ("OLED"), the method comprising:
    forming a first electrode on a substrate;
    defining at least one feature for the OLED, the feature having a first depth;
    selecting an organic layer for deposition on the substrate as a function of the layer's sublimation point and the first depth;
    forming the organic layer to electrically communicate with the first electrode;
    conformingly contacting a stamp with the organic layer and delaminating the stamp to subtractively form the at least one feature; and
    forming a second electrode over the organic layer.

12. The method of claim 11, further comprising interposing an electron transport material between the second electrode and the organic layer.

13. The method of claim 11, wherein the organic layer is selected from a group consisting of 3-(4-Biphenylyl)-4-phenyl-5-tert-butylphenyl-1,2,4-triazole ("TAZ"), and hole-transport materials N,N'-Bis(3-methylphenyl)-N,N'-bis(phenyl)-benzidine ("TPD"), N,N'-Bis(naphthalen-1-yl)-N,N'-bis(phenyl)-benzidine ("NPB"), and 9,9-Bis[4-(N,N-bis-naphthalen-2-yl-amino)phenyl]-9H-fluorene ("NPAPF").

14. The method of claim 11, wherein the organic layer further comprises a first film and a second film.

15. The method of claim 11, wherein the step of patterning a portion of the hole injection layer further comprises conformingly contacting a portion of the stamp with the hole injection layer without exerting pressure and at ambient temperature.

16. A method for forming a multi-array OLED panel, the method comprising the steps of:
    (a) forming a first electrode panel on a substrate, the first electrode communicating with each of a plurality of pixels for the OLED panel;
    (b) forming a first organic layer on the substrate, the organic layer extending to each of the plurality of pixels; and
    (c) conformingly contacting a stamp with the organic layer of one pixel and removing the stamp to form a first pattern having a feature and a depth on said pixel; and
    (d) moving at least one of the substrate or the stamp relative to the other and repeating step (c) to pattern the first pattern on at least one other pixels;
    wherein the organic layer is selected as a function of a sublimation temperature of the organic layer and the first depth and wherein the stamp is contacted with the organic layer absent an external pressure and is at ambient temperature.

17. The method of claim 16, wherein the step of conformingly contacting a stamp with the organic layer of one pixel further comprises simultaneously contacting a plurality of stamps with a plurality of pixel organic layers.

18. The method of claim 16, wherein after step (c) the substrate is moved relative to a stationary stamp.

19. The method of claim 16, wherein the organic layer is selected such that the length of the first depth is inversely proportional to the sublimation temperature.

20. The method of claim 16, further comprising simultaneously contacting a plurality of stamps with a plurality of pixels to independently form a plurality of features.

21. A device for manufacturing an OLED panel, the device comprising a processor circuit in communication with a memory circuit and an actuation system, the memory circuit storing instructions for the processor circuit to direct the actuation system to:
   position a substrate relative to a stamp at a first location, the substrate the having a first organic layer thereon and defining a plurality of OLED pixels;
   conformingly contact the stamp with a first of the plurality of OLED pixels;
   remove the stamp from the substrate to thereby remove a portion of the organic layer forming a first pattern on the organic layer; and
   position the substrate relative to the stamp at a second location.

22. The device of claim 21, wherein the actuation system conformingly contacts the stamp with the organic layer substantially free of external pressure.

23. The device of claim 21, wherein the stamp further comprises a plurality of ridges and wherein the plurality of ridges connect with a plurality of OLED pixels.

24. The device of claim 21, wherein the organic layer is selected such that the depth of the first pattern is inversely proportional to the sublimation temperature of the organic layer.

25. The device of claim 21, wherein the first of the plurality of pixels defines multiple pixels.

26. The device of claim 21, wherein the first of the plurality of pixels defines a pixel.

27. The device of claim 21, wherein positioning the substrate relative to the stamp at a second position further comprises directing the actuation system to contact the stamp with a second of the plurality of pixels.

\* \* \* \* \*